(12) United States Patent
Padyana et al.

(10) Patent No.: US 12,712,497 B2
(45) Date of Patent: Aug. 18, 2026

(54) MULTI-MODE BROADBAND LOW NOISE AMPLIFIER

(71) Applicant: Skyworks Solutions, Inc., Irvine, CA (US)

(72) Inventors: Aravind Kumar Padyana, Irvine, CA (US); Rimal Deep Singh, Irvine, CA (US); Junhyung Lee, Irvine, CA (US); Bipul Agarwal, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 257 days.

(21) Appl. No.: 18/771,672

(22) Filed: Jul. 12, 2024

(65) Prior Publication Data

US 2024/0372512 A1 Nov. 7, 2024

Related U.S. Application Data

(63) Continuation of application No. 18/482,240, filed on Oct. 6, 2023, now Pat. No. 12,074,573, which is a continuation of application No. 17/452,631, filed on Oct. 28, 2021, now Pat. No. 11,817,829.

(60) Provisional application No. 63/199,879, filed on Jan. 29, 2021.

(51) Int. Cl.
*H03F 3/189* (2006.01)
*H04B 1/16* (2006.01)

(52) U.S. Cl.
CPC ............... *H03F 3/189* (2013.01); *H04B 1/16* (2013.01); *H03F 2200/294* (2013.01); *H03F 2200/451* (2013.01)

(58) Field of Classification Search
CPC ...... H03F 1/223; H03F 1/56; H03F 2200/294; H03F 2200/451; H03F 3/189; H04B 1/16
See application file for complete search history.

(56) References Cited

U.S. PATENT DOCUMENTS

| | | | |
|---|---|---|---|
| 5,047,728 | A | 9/1991 | Bayruns |
| 5,724,657 | A | 3/1998 | Lin et al. |
| 5,761,250 | A | 6/1998 | Lin |
| 6,134,427 | A | 10/2000 | Hughes |
| 6,445,251 | B1 | 9/2002 | Robinson |
| 6,498,926 | B1 | 12/2002 | Ciccarelli et al. |
| 6,744,322 | B1 | 6/2004 | Ma et al. |

(Continued)

OTHER PUBLICATIONS

Adabi et al., "30 GHz CMOS low noise amplifier", in Proc. IEEE Radio Freq. Integr. Circuits (RFIC) Symp., pp. 625-628 (Jun. 2007).

(Continued)

*Primary Examiner* — Nguyen T Vo
(74) *Attorney, Agent, or Firm* — Knobbe, Martens, Olson & Bear, LLP

(57) ABSTRACT

Multi-mode broadband low noise amplifiers (LNAs) are disclosed herein. In certain embodiments, an LNA includes a first amplification stage and a second amplification stage having a lower gain than the first amplification stage. The LNA is operable in a plurality of operating modes including a first mode in which the first amplification stage and the second amplification stage operate in a cascade to amplify a radio frequency (RF) receive signal, and a second mode in which the first amplification stage amplifies the RF receive signal and the second amplification stage is bypassed.

20 Claims, 14 Drawing Sheets

(56) References Cited

U.S. PATENT DOCUMENTS 6,804,359 B1 10/2004 Yu et al.
7,808,342 B2 10/2010 Prikhodko et al.
7,839,234 B2 11/2010 Prikhodko et al.
7,898,469 B2 3/2011 Ujita et al.
8,140,025 B2 3/2012 Gorbachov
8,319,562 B2 11/2012 Sun et al.
8,644,773 B2 2/2014 Cebi
8,704,597 B2 4/2014 Yu et al.
8,717,100 B2 5/2014 Reisner et al.
8,797,104 B2 8/2014 Hsieh et al.
8,970,296 B1 3/2015 Pratt
9,054,663 B2 6/2015 Reisner et al.
9,252,077 B2 2/2016 Molzer et al.
9,305,859 B2 4/2016 Williams et al.
9,407,215 B2 8/2016 Gill
9,478,977 B2 10/2016 Li et al.
9,503,025 B2 11/2016 Cao et al.
9,602,064 B2 3/2017 Wu et al.
9,667,206 B2 5/2017 Anderson et al.
9,674,006 B2 6/2017 Zhu et al.
9,692,473 B2 6/2017 Gard et al.
9,698,740 B2 7/2017 Lin et al.
9,721,936 B2 8/2017 Zhu et al.
9,735,737 B2 8/2017 Gorbachov et al.
9,741,653 B2 8/2017 Roy et al.
9,813,029 B2 11/2017 Zhu et al.
9,831,841 B2 11/2017 Wu et al.
9,852,978 B2 12/2017 Roy et al.
9,893,682 B2 2/2018 Zhu et al.
9,973,148 B2 5/2018 Zhu et al.
9,991,885 B2 6/2018 Zhu et al.
10,050,002 B2 8/2018 Roy et al.
10,063,200 B2 8/2018 Wu et al.
10,084,416 B2 9/2018 Wallis
10,103,693 B2 10/2018 Zhu et al.
10,103,772 B2 * 10/2018 Pehlke ...................... H03F 3/72
10,122,333 B2 11/2018 Roberg
10,135,408 B2 11/2018 Cao et al.
10,147,990 B2 12/2018 Cebi
10,164,582 B2 12/2018 Zhu et al.
10,171,045 B2 1/2019 Pehlivanoglu
10,320,350 B1 * 6/2019 Leitner ..................... H03F 3/72
10,574,287 B1 2/2020 Thoppay Egambaram et al.
11,595,008 B2 2/2023 Jain et al.
11,817,829 B2 11/2023 Padyana et al.
11,923,808 B2 3/2024 Jain et al.
12,074,573 B2 8/2024 Padyana et al.
12,184,240 B2 12/2024 Jain et al.
12,212,294 B2 1/2025 Jain et al.
2007/0066256 A1 3/2007 Lee
2012/0202445 A1 8/2012 Manetakis
2013/0057343 A1 3/2013 Kondo
2016/0142085 A1 5/2016 Choksi et al.
2016/0192295 A1 6/2016 Son et al.
2017/0005624 A1 1/2017 Zhu et al.
2017/0005626 A1 1/2017 Zhu et al.
2017/0040792 A1 2/2017 Li et al.
2017/0162705 A1 6/2017 Gorbachov et al.
2017/0163226 A1 6/2017 Gorbachov et al.
2017/0300076 A1 10/2017 Liang et al.
2017/0301630 A1 10/2017 Nguyen et al.
2017/0301985 A1 10/2017 Nguyen et al.
2017/0301986 A1 10/2017 Nguyen et al.
2017/0310284 A1 10/2017 Altunkilic et al.
2017/0317648 A1 11/2017 Gorbachov et al.
2018/0026592 A1 1/2018 Wallis
2018/0041204 A1 2/2018 Zhu et al.
2018/0047715 A1 2/2018 Zhu et al.
2018/0048345 A1 2/2018 Pehlke et al.
2018/0054166 A1 2/2018 Pehlivanoglu
2018/0062582 A1 3/2018 Pehlivanoglu
2018/0062599 A1 3/2018 Lee et al.
2018/0069511 A1 3/2018 Zhu et al.
2018/0076774 A1 * 3/2018 Pehlke .................... H03F 3/195
2018/0138990 A1 5/2018 Bergsma et al.
2018/0145648 A1 5/2018 Ye et al.
2018/0175797 A1 * 6/2018 Lee ...................... H03G 1/0088
2018/0175814 A1 6/2018 Wu et al.
2018/0183431 A1 6/2018 Zhu et al.
2018/0226367 A1 8/2018 Babcock et al.
2018/0261566 A1 9/2018 Babcock et al.
2018/0323778 A1 11/2018 Zhu et al.
2018/0324967 A1 11/2018 Mcgehee et al.
2018/0331657 A1 11/2018 Zhu et al.
2018/0337670 A1 11/2018 Zhu et al.
2019/0007002 A1 1/2019 Wallis
2019/0058446 A1 2/2019 Zhu et al.
2019/0074813 A1 3/2019 Zou et al.
2019/0097591 A1 3/2019 Pehlivanoglu
2019/0139923 A1 5/2019 Roy et al.
2019/0149102 A1 5/2019 Altunkilic et al.
2019/0158028 A1 5/2019 Pehlivanoglu
2019/0181815 A1 6/2019 Wallis
2019/0190461 A1 6/2019 Zhu et al.
2019/0190462 A1 6/2019 Zhu et al.
2019/0190623 A1 6/2019 Bergsma et al.
2019/0198990 A1 6/2019 Nguyen et al.
2019/0199344 A1 6/2019 Zhu et al.
2019/0214354 A1 7/2019 Soliman et al.
2019/0229679 A1 7/2019 Gorbachov et al.
2019/0252875 A1 8/2019 Li et al.
2019/0273076 A1 9/2019 Zhu et al.
2019/0273475 A1 9/2019 Ye et al.
2019/0273478 A1 9/2019 Lin et al.
2019/0273480 A1 9/2019 Lin et al.
2019/0341687 A1 11/2019 Nguyen et al.
2020/0014381 A1 1/2020 Zhu et al.
2020/0052657 A1 2/2020 Zhu et al.
2020/0052660 A1 2/2020 Cao et al.
2020/0119741 A1 4/2020 Jain et al.
2020/0119742 A1 4/2020 Jain et al.
2020/0154434 A1 5/2020 Balteanu
2020/0169285 A1 5/2020 Arfaei Malekzadeh et al.
2020/0227372 A1 7/2020 Roy et al.
2020/0266777 A1 8/2020 Arfaei Malekzadeh et al.
2020/0272182 A1 8/2020 Liang et al.
2020/0279825 A1 9/2020 Babcock et al.
2020/0336122 A1 10/2020 Lin et al.
2020/0357756 A1 11/2020 Wallis
2020/0366256 A1 11/2020 Pehlivanoglu
2020/0389166 A1 12/2020 Zhu et al.
2021/0234518 A1 7/2021 Luo
2023/0095653 A1 3/2023 Jain et al.
2024/0171128 A1 5/2024 Jain et al.
2025/0183864 A1 6/2025 Jain et al.

OTHER PUBLICATIONS

Bhattacharya et al., "A 28GHZ, 7mW, 32dB gain and 3.3dB NF, gmboosted CG-CS LNA for 5G RF beamformers", pp. 62-64, 2019 12th Global Symposium on Millimeter Waves (GSMM).

Dang et al., "A K-band High Gain, Low Noise Figure LNA using 0.13 m Logic CMOS Technology ", in 10th European Microwave Integrated Circuits Conference 2015.

Elkholy et al., "A wideband variable gain LNA with high OIP3 for 5G using 40-nm bulk CMOS", IEEE Microw. Wireless Compon. Lett., vol. 28(1):64-66 (Jan. 2018).

Guo et al., "A transformer feedback Gm-boosting technique for gain improvement and noise reduction in mm-Wave cascode LNAs", IEEE Trans. Microw. Theory Techn., vol. 64(7):2080-2090 (Jul. 2016).

Hedayati et al., "A 33-GHz LNA for 5G Wireless Systems in 28-nm Bulk CMOS", in IEEE Transactions on Circuits and Systems II: Express Brief vol. 65(10), Oct. 2018.

Huang, "A Ka-band CMOS low-noise amplifier for Ka-band communication system", In Proceedings of the World Congress on Engineering and Computer Science, vol. 2 (2010).

Kolios et al., "Transformer & Marchand Integrated Baluns of Extremely Small Size for 60 GHz Applications in 65nm CMOS Technology", in 2016 21st International Conference on Microwave, Radar and Wireless Communications (MIKON).

(56) References Cited

OTHER PUBLICATIONS

Lee et al, "A Ka-Band Phase-Compensated Variable-Gain CMOS Low-Noise Amplifier," in IEEE Microwave and Wireless Components Letters, Feb. 2019.
Onoe, "Evolution of 5G mobile technology toward Jan. 2020 and beyond, " in 2016 IEEE Int. Solid-State Circuits Conf. (ISSCC), pp. 23-28 (2016).
Qin et al., "Compact wideband LNA with gain and input matching bandwidth extensions by transformer", IEEE Microwave and Wireless Components Letters, vol. 27(7):657-659 (Jul. 2017).
Sanduleanu et al., "31-34GHz low noise amplifier with on-chip microstrip lines and inter-stage matching in 90-nm baseline CMOS, " in IEEE Radio Frequency Integrated Circuits (RFIC) Symp., 2006.

* cited by examiner

MULTI-MODE BROADBAND LOW NOISE AMPLIFIER

CROSS-REFERENCE TO RELATED APPLICATIONS

This application is a continuation of U.S. patent application Ser. No. 18/482,240, filed Oct. 6, 2023 and titled "MULTI-MODE BROADBAND LOW NOISE AMPLIFIER," which is a continuation of U.S. patent application Ser. No. 17/452,631, filed Oct. 28, 2021 and titled "MULTI-MODE BROADBAND LOW NOISE AMPLIFIER," which claims the benefit of priority under 35 U.S.C. § 119 of U.S. Provisional Patent Application No. 63/199,879, filed Jan. 29, 2021 and titled "MULTI-MODE BROADBAND LOW NOISE AMPLIFIER," which is herein incorporated by reference in its entirety.

BACKGROUND

Technical Field

Embodiments of the invention relate to electronic systems, and in particular, to radio frequency (RF) electronics.

Description of Related Technology

A low noise amplifier (LNA) can be used to boost the amplitude of a relatively weak radio frequency (RF) signal received via an antenna. Thereafter, the boosted RF signal can be used for a variety of purposes, including, for example, driving a switch, a mixer, and/or a filter in an RF communication system.

Examples of RF communication systems with one or more LNAs include, but are not limited to, mobile phones, tablets, base stations, network access points, customer-premises equipment (CPE), laptops, and wearable electronics.

LNAs can be included in RF communication systems to amplify signals of a wide range of frequencies. For example, an LNA can be used to provide low noise amplification to RF signals in a frequency range of about 30 kHz to 300 GHz, such as in the range of about 410 MHz to about 7.125 GHz for fifth generation (5G) communications using Frequency Range 1 (FR1) or in the range of about 24.25 GHz to 52.6 GHz for 5G communications using Frequency Range 2 (FR2).

SUMMARY

In certain embodiments, the present disclosure relates to a low noise amplifier. The low noise amplifier includes an input configured to receive a radio frequency receive signal, a first amplification stage, and a second amplification stage having a lower gain than the first amplification stage. The low noise amplifier is operable in a first gain mode in which the first amplification stage and the second amplification stage operate in a cascade to amplify the radio frequency receive signal, and a second gain mode in which the first amplification stage amplifies the radio frequency receive signal and the second amplification stage is bypassed.

In some embodiments, the low noise amplifier is further operable in a third gain mode in which the second amplification stage amplifies the radio frequency receive signal and the first amplification stage is bypassed. According to various embodiments, the first gain mode is a high gain mode, the second gain mode is a mid gain mode, and the third gain mode is a low gain mode. In accordance with a number of embodiment, the low noise amplifier further includes an inter-stage attenuator that is in cascade with the second amplification stage in the third gain mode.

In several embodiments, the first amplification stage includes a plurality of selectable gain transistors, and a chosen combination of the selectable gain transistors is different for the first gain mode and the second gain mode. According to a number of embodiments, a fewer number of the selectable gain transistors are chosen in the second gain mode relative to the first gain mode. In accordance with various embodiments, the first amplification stage further includes a gate capacitance compensation capacitor that is activated in the second gain mode and deactivated in the first gain mode. According to some embodiments, the low noise amplifier further includes a pre-attenuator, the low noise amplifier further operable in a third gain mode in which the pre-attenuator and the first amplification stage are in cascade and the second amplification stage is bypassed.

In a number of embodiments, an amount of degeneration inductance of at least one of the first amplification stage or the second amplification stage changes between the first gain mode and the second gain mode.

In various embodiments, the low noise amplifier further includes a tank circuit connected to an output of the first amplification stage, the tank circuit including at least one controllable component having a different value in the first gain mode relative to the second gain mode.

In several embodiments, the low noise amplifier further includes an input capacitor that is activated when the radio frequency receive signal is in a first frequency band, and deactivated when the radio frequency receive signal is in a second frequency band.

In some embodiments, the first amplification stage and the second amplification stage are each a cascode amplifier stage.

In various embodiments, the low noise amplifier further includes a phase shifter connected to an output and configured to compensate for a phase difference of the low noise amplifier between the first gain mode and the second gain mode.

In certain embodiments, the present disclosure relates to a method of low noise amplification. The method includes receiving a radio frequency receive signal at an input of the low noise amplifier, and amplifying the radio frequency receive signal using a cascade of a first amplification stage and a second amplification stage in a first gain mode of the low noise amplifier. The second amplification stage has a lower gain than the first amplification stage. The method further includes amplifying the radio frequency receive signal using the first amplification stage and bypassing the second amplification stage in a second gain mode of the low noise amplifier.

In some embodiments, the method further includes amplifying the radio frequency receive signal using the second amplification stage and bypassing the first amplification stage in a third gain mode of the low noise amplifier low. According to a number of embodiments, the first gain mode is a high gain mode, the second gain mode is a mid gain mode, and the third gain mode is a low gain mode. In accordance with various embodiments, the method further includes amplifying the radio frequency receive signal using the first amplification stage and bypassing the second amplification stage in a third gain mode of the low noise amplifier low, and pre-attenuating the radio frequency signal in the third gain mode.

In certain embodiments, the present disclosure relates to a wireless device. The wireless device includes an antenna configured to generate a radio frequency receive signal in response to a radio wave, and a front end system including a low noise amplifier configured to receive the radio frequency receive signal at an input. The low noise amplifier includes a first amplification stage and a second amplification stage having a lower gain than the first amplification stage. The low noise amplifier is operable in a first gain mode in which the first amplification stage and the second amplification stage operate in a cascade to amplify the radio frequency receive signal, and a second gain mode in which the first amplification stage amplifies the radio frequency receive signal and the second amplification stage is bypassed.

In several embodiments, the low noise amplifier is further operable in a third gain mode in which the second amplification stage amplifies the radio frequency receive signal and the first amplification stage is bypassed. According to a number of embodiments, the first gain mode is a high gain mode, the second gain mode is a mid gain mode, and the third gain mode is a low gain mode. According to various embodiments, the low noise amplifier further includes an inter-stage attenuator in cascade with the second amplification stage in the third gain mode.

In some embodiments, the first amplification stage includes a plurality of selectable gain transistors, and a chosen combination of the selectable gain transistors is different for the first gain mode and the second gain mode. According to a number of embodiments, a fewer number of the selectable gain transistors are chosen in the second gain mode relative to the first gain mode. In accordance with various embodiments, the low noise amplifier further includes a pre-attenuator, the low noise amplifier further operable in a third gain mode in which the pre-attenuator and the first amplification stage are in cascade and the second amplification stage is bypassed.

In several embodiments, an amount of degeneration inductance of at least one of the first amplification stage or the second amplification stage changes between the first gain mode and the second gain mode.

In various embodiments, the low noise amplifier further includes a tank circuit connected to an output of the first amplification stage, the tank circuit including at least one controllable component having a different value in the first gain mode relative to the second gain mode.

In some embodiments, the low noise amplifier further includes an input capacitor that is activated when the radio frequency receive signal is in a first frequency band, and deactivated when the radio frequency receive signal is in a second frequency band.

In a number of embodiments, the low noise amplifier further includes a phase shifter connected to an output and configured to compensate for a phase difference of the low noise amplifier between the first gain mode and the second gain mode.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figure 1:
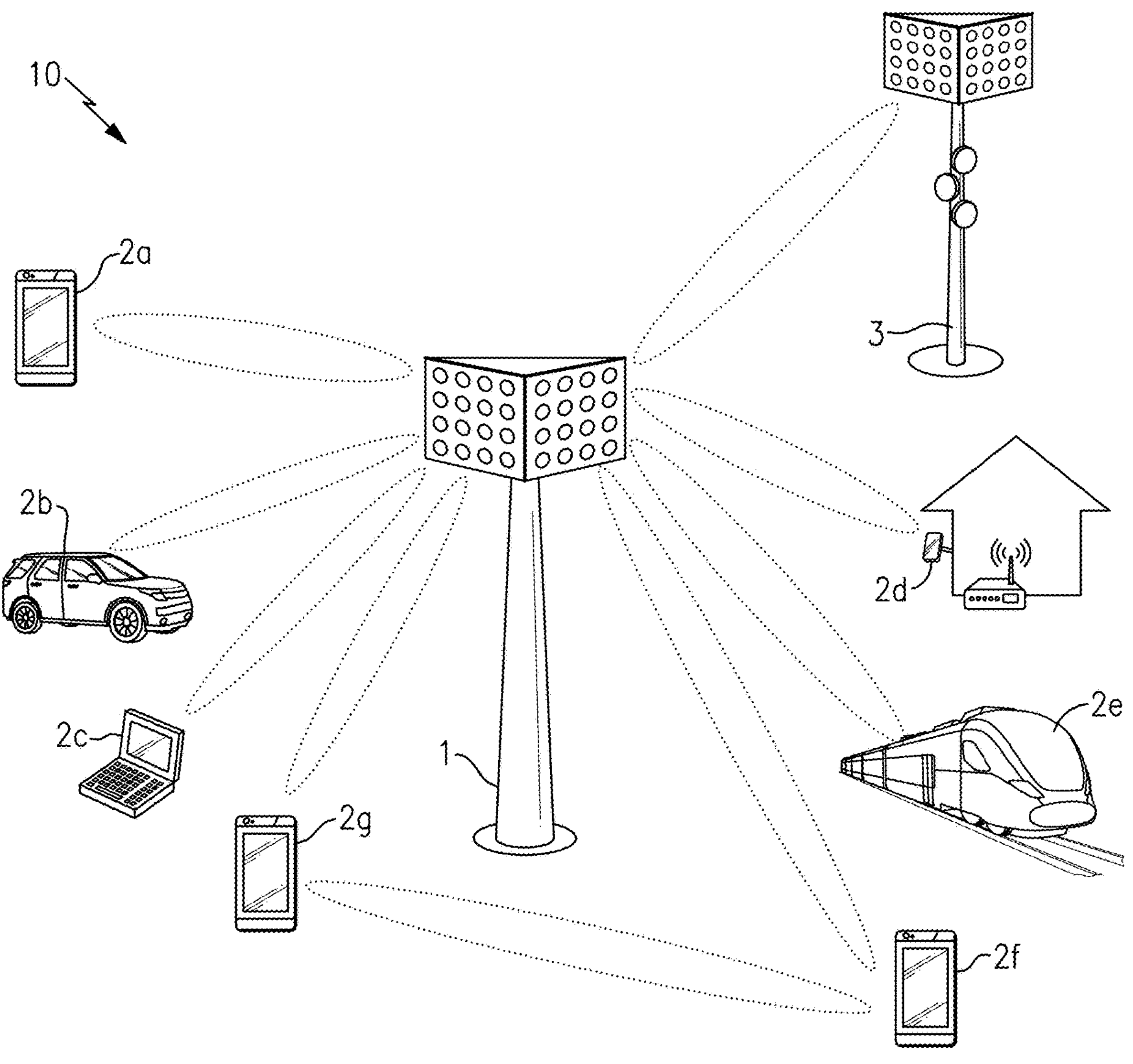
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IoT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2*c*, a stationary wireless device 2*d*, a wireless-connected train 2*e*, a second mobile device 2*f*, and a third mobile device 2*g*.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul (for instance, as between mobile device 2*g* and mobile device 2*f*).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
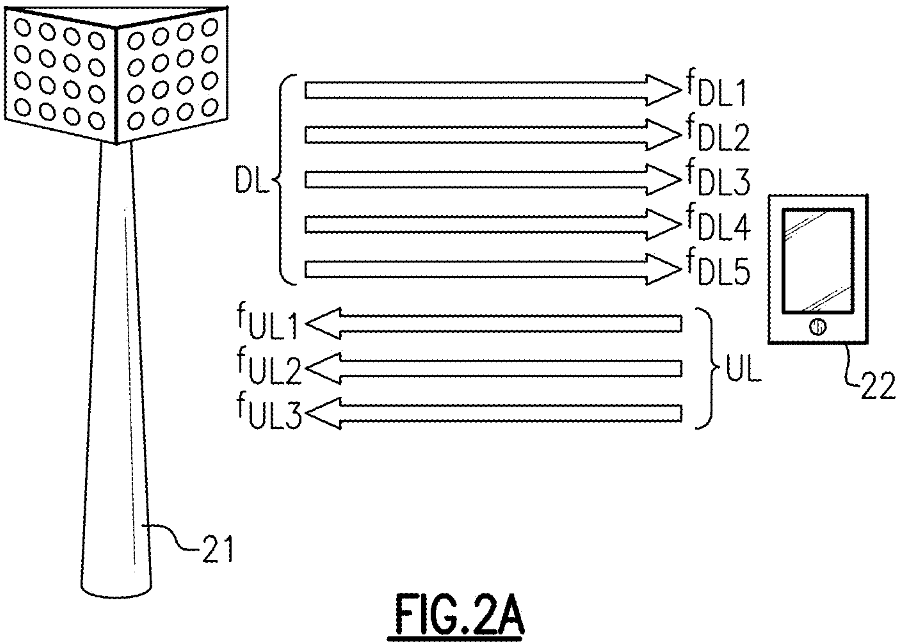
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
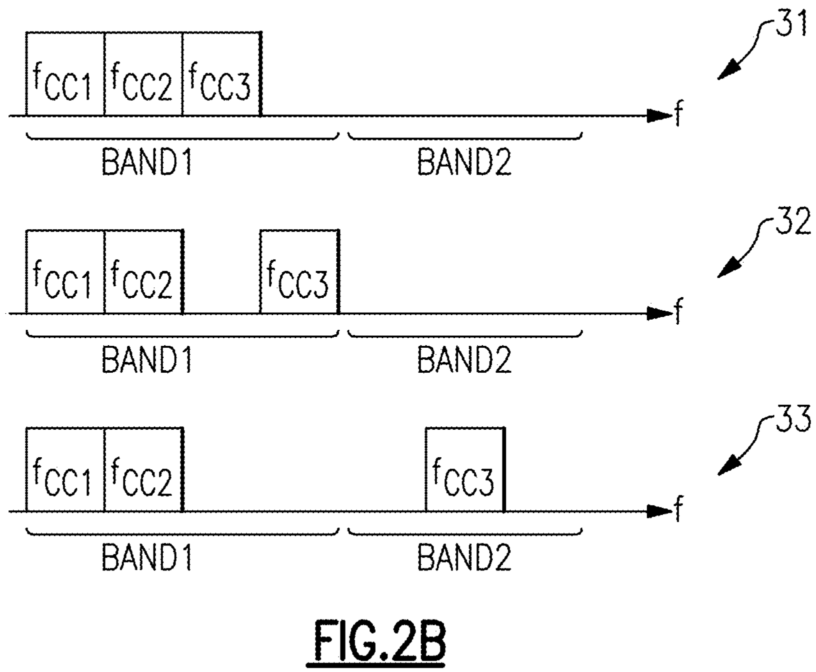
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
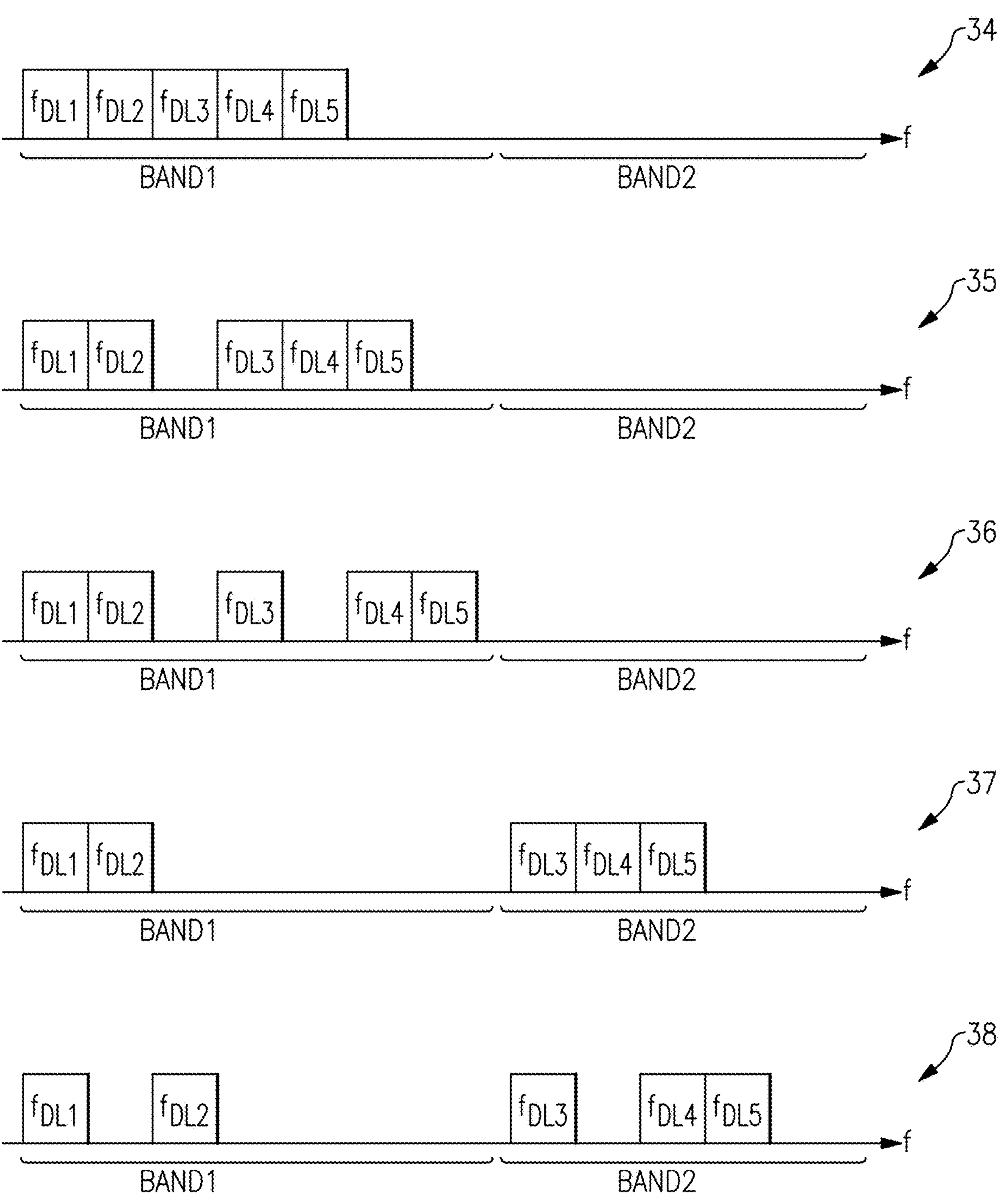
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and secondary cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink.

Figure 3A:
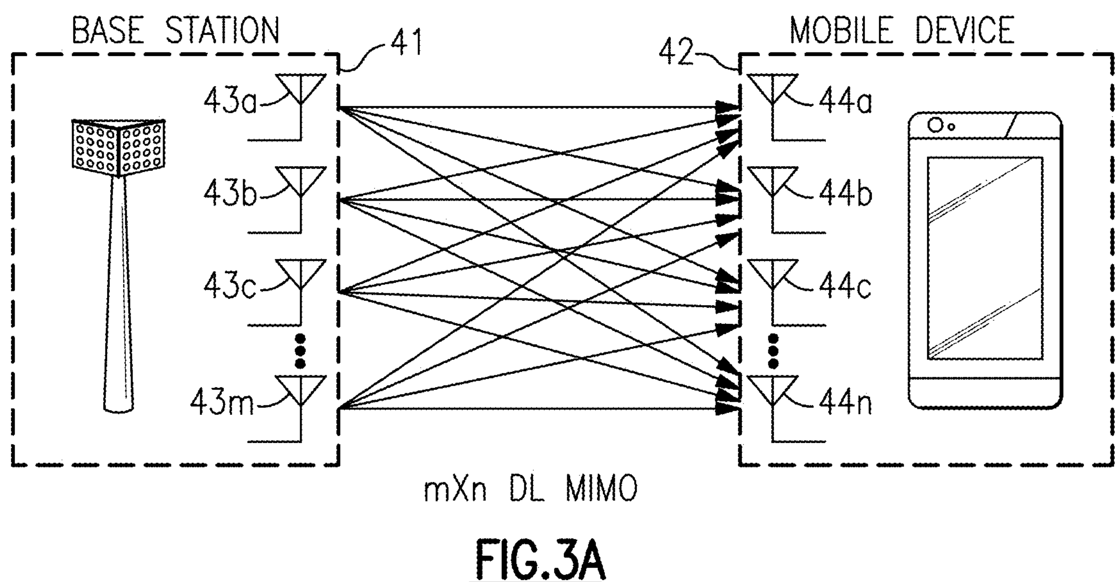
FIG. 3A is a schematic diagram of one example of a downlink channel using multi-input and multi-output (MIMO) communications.
Figure 3B:
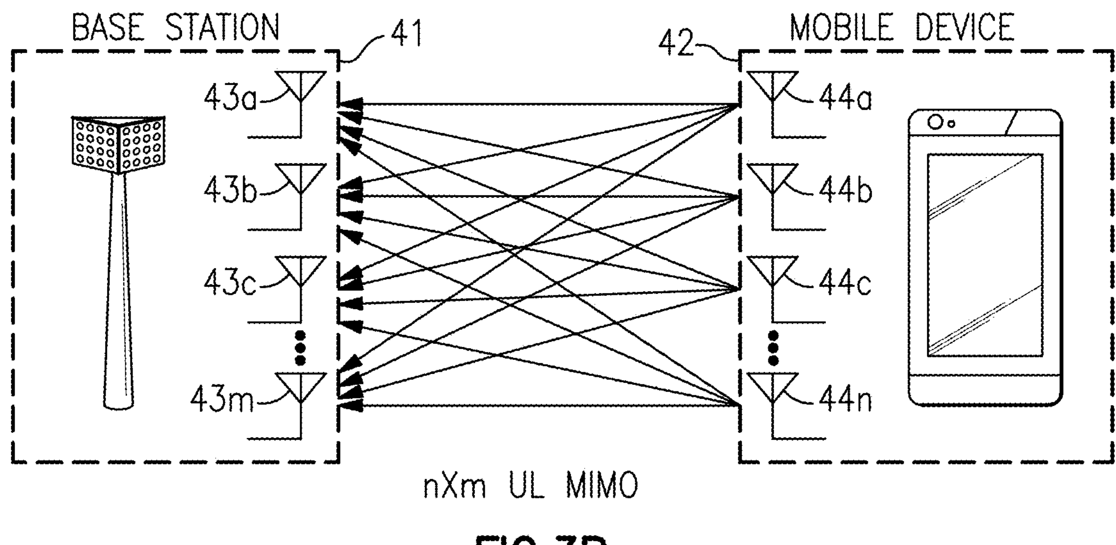
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of n×m UL MIMO.

By increasing the level or order of MIMO, bandwidth of an uplink channel and/or a downlink channel can be increased.

MIMO communications are applicable to communication links of a variety of types, such as FDD communication links and TDD communication links.

Figure 3C:
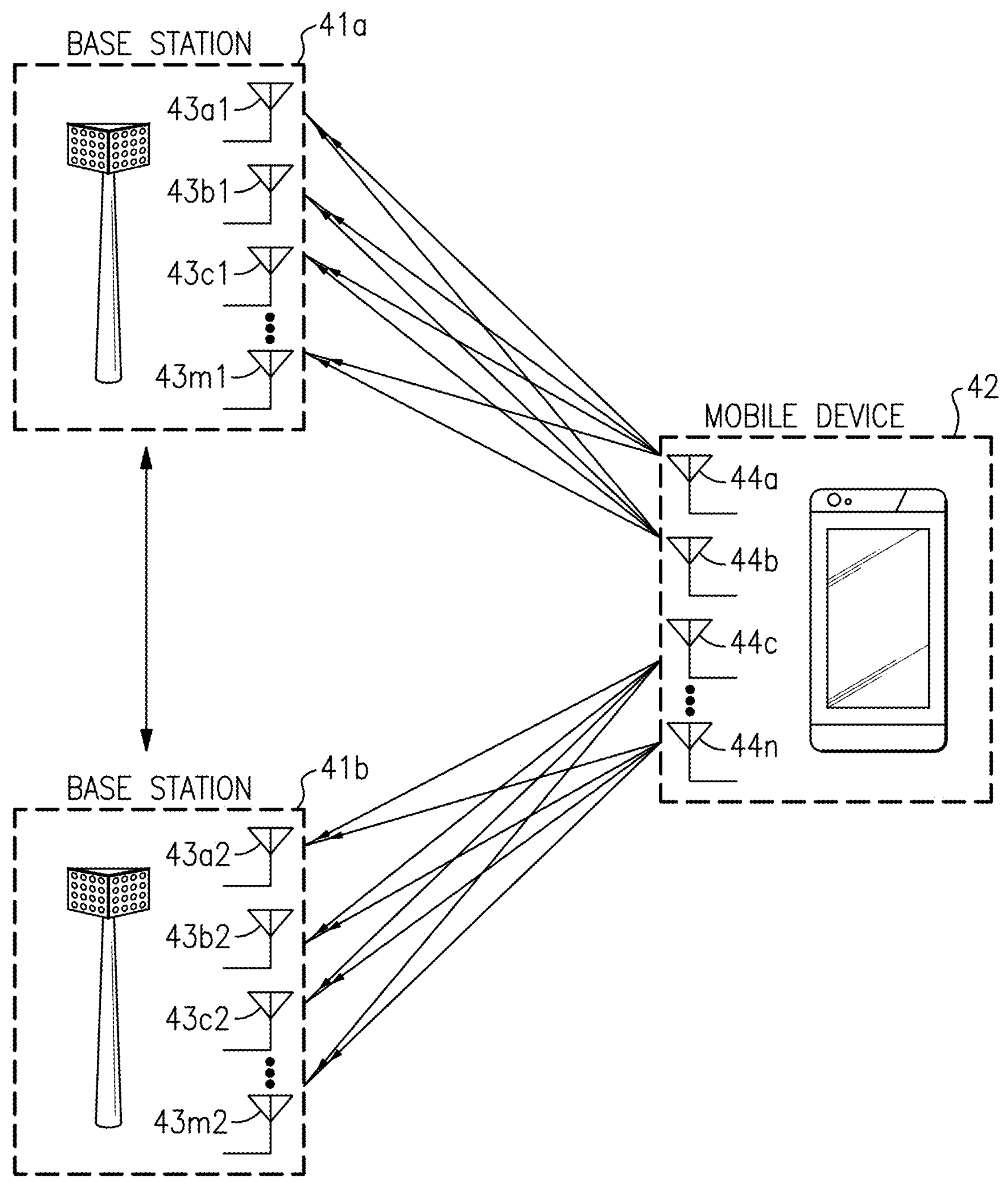
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44*a*, 44*b*, 44*c*, . . . 44*n* of the mobile device 42. Additional a first portion of the uplink transmissions are received using M antennas 43*a*1, 43*b*1, 43*c*1, . . . 43*m*1 of a first base station 41*a*, while a second portion of the uplink transmissions are received using M antennas 43*a*2, 43*b*2, 43*c*2, . . . 43*m*2 of a second base station 41*b*. Additionally, the first base station 41*a* and the second base station 41*b* communication with one another over wired, optical, and/or wireless links.

The MIMO scenario of FIG. 3C illustrates an example in which multiple base stations cooperate to facilitate MIMO communications.

Figure 4A:
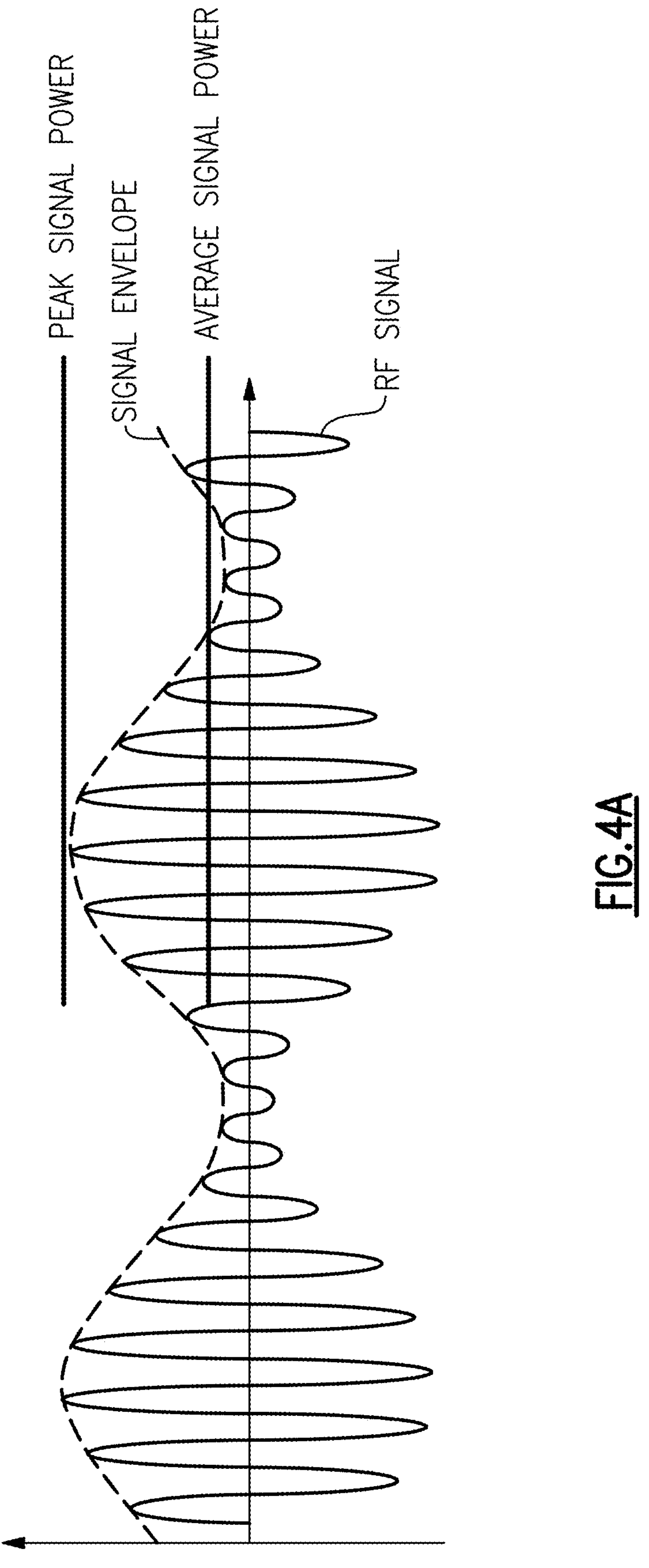
FIG. 4A is a graph illustrating one example of an RF signal waveform versus time.

FIG. 4A is a graph illustrating one example of an RF signal waveform versus time. The graph depicts the RF signal waveform, the envelope of the RF signal, the average signal power, and the peak signal power. The peak to average power ratio (PAPR) or crest factor of the RF signal waveform corresponds to the ratio of the waveform's peak signal power to the waveform's average signal power.

Figure 4B:
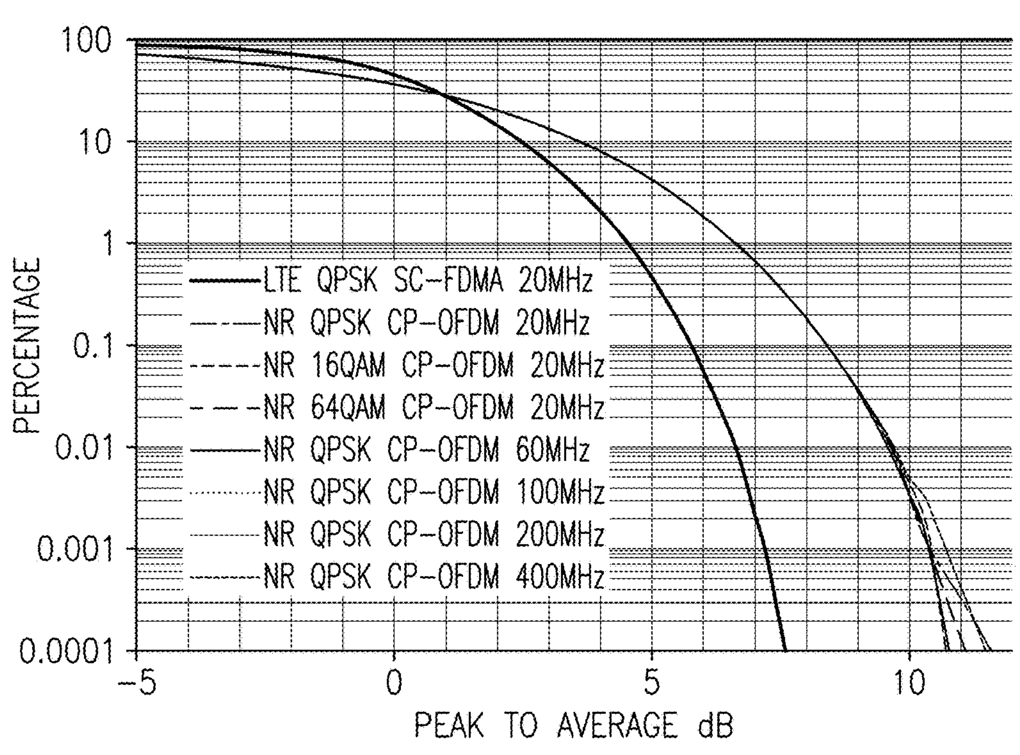
FIG. 4B is one example of a peak to average power ratio (PAPR) complementary cumulative distribution function (CCDF) for various cyclic prefix orthogonal frequency division multiplexing (CP-OFDM) waveforms relative to a single carrier frequency division multiple access (SC-FDMA) reference waveform.

FIG. 4B is one example of a PAPR complementary cumulative distribution function (CCDF) for various cyclic prefix orthogonal frequency division multiplexing (CP-OFDM) waveforms relative to a single carrier frequency division multiple access (SC-FDMA) reference waveform.

As shown in FIG. 4B, the PAPR CCDF is shown for a variety of modulation orders and bandwidths of CP-OFDM 5G NR waveforms. For the example waveforms shown, higher order modulations and wider signal bandwidth does not substantially increase PAPR, but rather the CP-OFDM waveforms have similar PAPR to one another.

When comparing 5G NR CP-OFDM waveforms to the reference LTE SC-FDMA QPSK waveform it can be seen that the 5G NR waveforms exhibit higher PAPR of about 3 dB or more. The higher PAPR raises a linearity constraint for a power amplifier. Moreover, for UE operating at a cell edge and/or with poor SNR, higher PAPR can constrain output power and/or increase battery current.

Figure 4C:
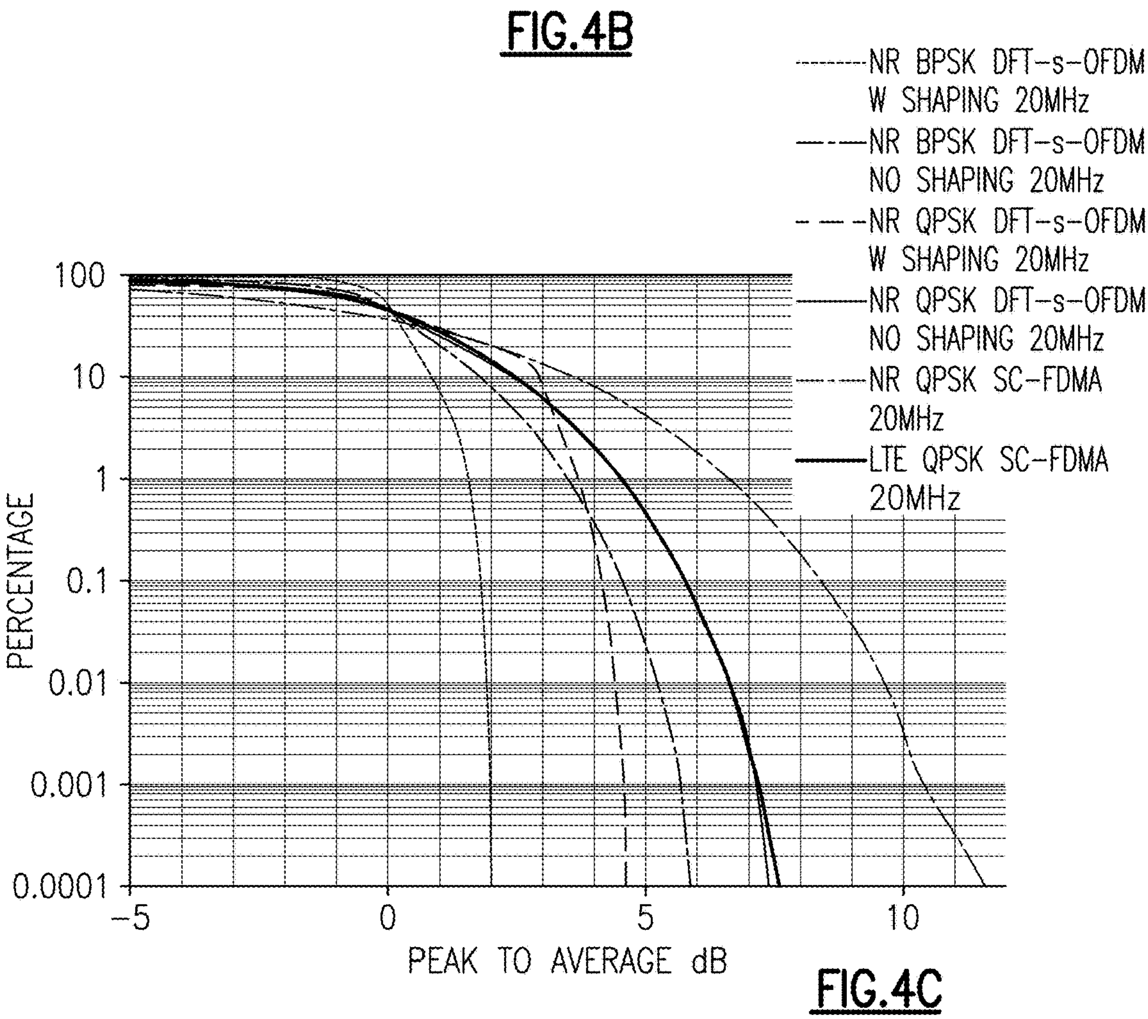
FIG. 4C is one example of a PAPR CCDF for various discrete Fourier transformation-spread-orthogonal frequency division multiplexing (DFT-s-OFDM) waveforms relative to a SC-FDMA reference waveform and a quadrature phase shift keying (QPSK) CP-OFDM 20 megahertz (MHz) waveform.

FIG. 4C is one example of a PAPR CCDF for various discrete Fourier transformation-spread-orthogonal frequency division multiplexing (DFT-s-OFDM) waveforms relative to a SC-FDMA reference waveform and a QPSK CP-OFDM 20 MHZ waveform.

As shown in FIG. 4C, the PAPR CCDF is shown for a variety of modulation order and bandwidths of CP-OFDM 5G NR waveforms, with or without spectral shaping. The QPSK DFT-s-OFDM 20 MHz waveform without shaping has similar PAPR behavior as the reference LTE SC-FDMA QPSK waveform.

As shown by a comparison of FIGS. 4B and 4C, the DFT-s-OFDM waveforms of FIG. 4C operate with lower PAPR relative to the CP-OFDM waveforms of FIG. 4B. In certain implementations half pi (PI/2) binary phase shift keying (BPSK) and/or spectral shaping techniques can be used to reduce PAPR. For instance, for the examples shown, spectral shaping techniques selectively enable 2 dB PAPR improvement for QPSK and 5 dB improvement for PI/2 BPSK DFT-s-OFDM waveforms when compared to the reference LTE signal.

Figure 5A:
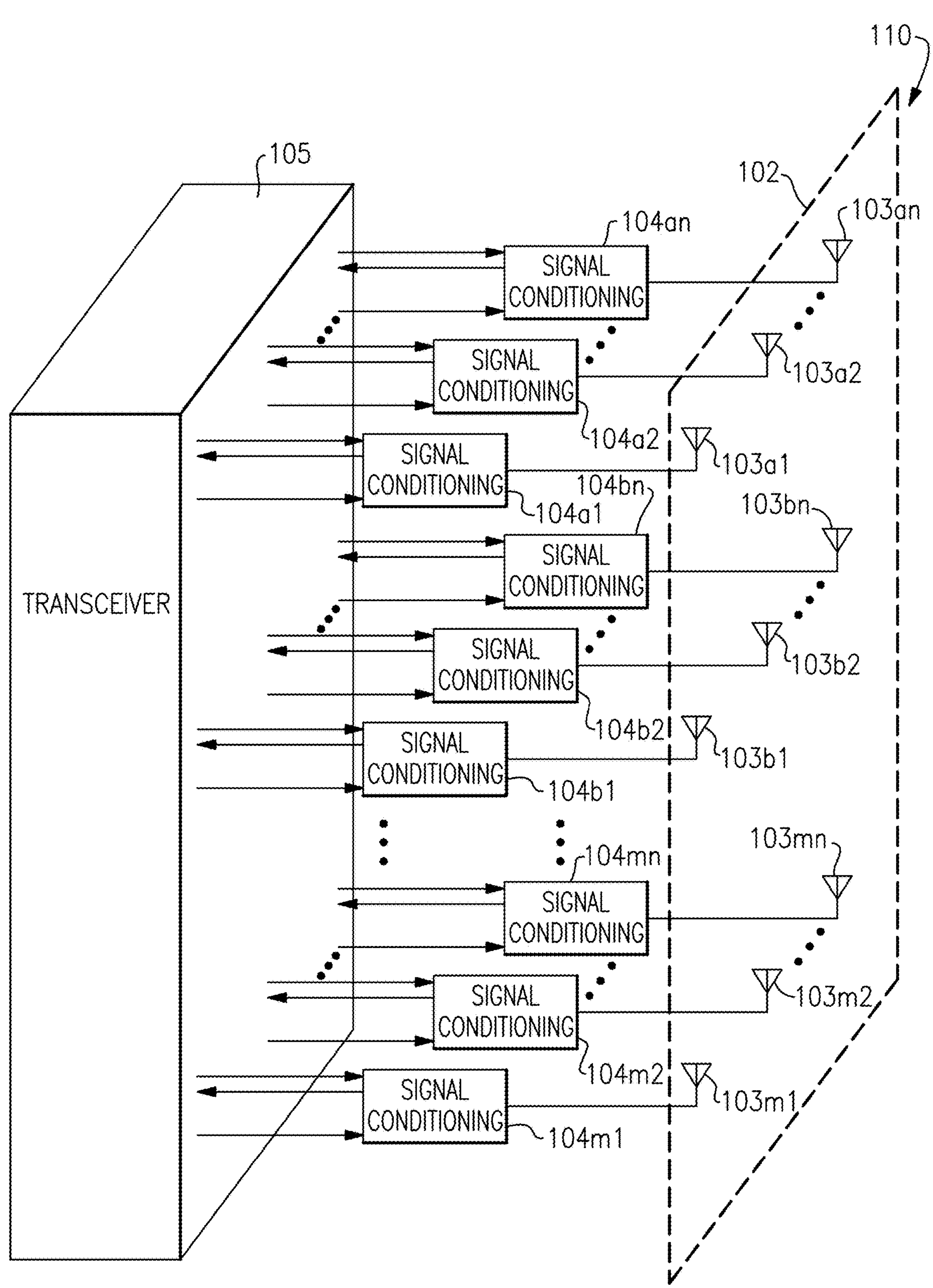
FIG. 5A is a schematic diagram of one example of a communication system that operates with beamforming.

FIG. 5A is a schematic diagram of one example of a communication system 110 that operates with beamforming. The communication system 110 includes a transceiver 105, signal conditioning circuits 104*a*1, 104*a*2 . . . 104*an*, 104*b*1, 104*b*2 . . . 104*bn*, 104*m*1, 104*m*2 . . . 104*mn*, and an antenna array 102 that includes antenna elements 103*a*1, 103*a*2 . . . 103*an*, 103*b*1, 103*b*2 . . . 103*bn*, 103*m*1, 103*m*2 . . . 103*mn*.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 5A, the transceiver 105 generates control signals for the signal conditioning circuits. The control signals can be used for a variety of functions, such as controlling the gain and phase of transmitted and/or received signals to control beamforming.

Figure 5B:
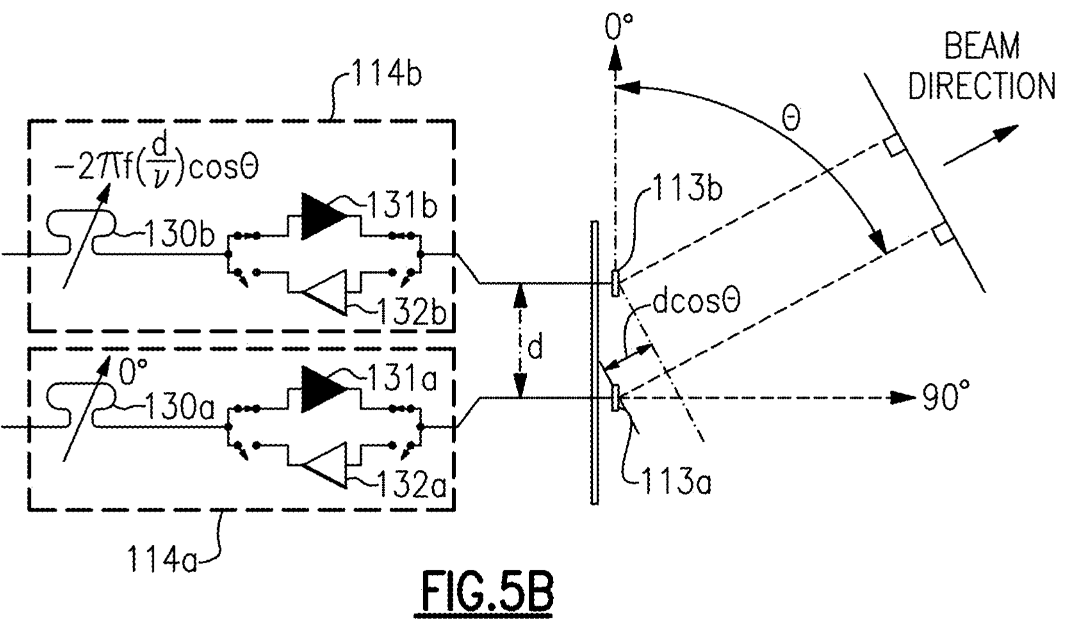
FIG. 5B is a schematic diagram of one example of beamforming to provide a transmit beam.

FIG. 5B is a schematic diagram of one example of beamforming to provide a transmit beam. FIG. 5B illustrates a portion of a communication system including a first signal conditioning circuit 114*a*, a second signal conditioning circuit 114*b*, a first antenna element 113*a*, and a second antenna element 113*b*.

Although illustrated as included two antenna elements and two signal conditioning circuits, a communication system can include additional antenna elements and/or signal conditioning circuits. For example, FIG. 5B illustrates one embodiment of a portion of the communication system 110 of FIG. 5A.

The first signal conditioning circuit 114*a* includes a first phase shifter 130*a*, a first power amplifier 131*a*, a first low noise amplifier (LNA) 132*a*, and switches for controlling selection of the power amplifier 131*a* or LNA 132*a*. Additionally, the second signal conditioning circuit 114*b* includes a second phase shifter 130*b*, a second power amplifier 131*b*, a second LNA 132*b*, and switches for controlling selection of the power amplifier 131*b* or LNA 132*b*.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113*a* and the second antenna element 113*b* are separated by a distance d. Additionally, FIG. 5B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113*a*, 113*b*, a desired transmit beam angle Θ can be achieved. For example, when the first phase shifter 130*a* has a reference value of 0°, the second phase shifter 130*b* can be controlled to provide a phase shift of about −2πf(d/v)cos Θ radians, where f is the fundamental frequency of the transmit signal, d is the distance between the antenna elements, v is the velocity of the radiated wave, and x is the mathematic constant pi.

In certain implementations, the distance d is implemented to be about ½λ, where A is the wavelength of the fundamental component of the transmit signal. In such implementations, the second phase shifter 130*b* can be controlled to provide a phase shift of about −π cos Θ radians to achieve a transmit beam angle Θ.

Accordingly, the relative phase of the phase shifters 130*a*, 130*b* can be controlled to provide transmit beamforming. In certain implementations, a baseband processor and/or a transceiver (for example, the transceiver 105 of FIG. 5A) controls phase values of one or more phase shifters and gain values of one or more controllable amplifiers to control beamforming.

Figure 5C:
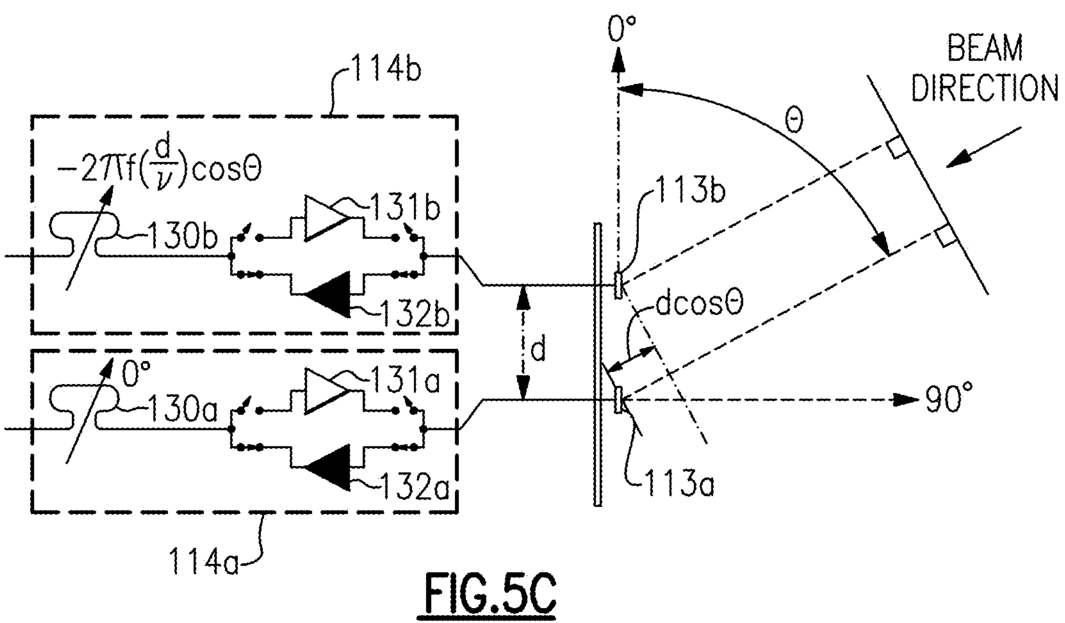
FIG. 5C is a schematic diagram of one example of beamforming to provide a receive beam.

FIG. 5C is a schematic diagram of one example of beamforming to provide a receive beam. FIG. 5C is similar to FIG. 5B, except that FIG. 5C illustrates beamforming in the context of a receive beam rather than a transmit beam.

As shown in FIG. 5C, a relative phase difference between the first phase shifter 130*a* and the second phase shifter 130*b* can be selected to about equal to −2πf(d/v)cos Θ radians to achieve a desired receive beam angle Θ. In implementations in which the distance d corresponds to about ½λ, the phase difference can be selected to about equal to −π cos Θ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Examples of Multi-Mode Broadband LNAs

In certain applications, it is desirable for a single low noise amplifier (LNA) to cover multiple frequency bands, for instance, 5G bands n77/78 (3.3 GHz to 4.2 GHz) and n79 (4.4 GHz to 5 GHz). Providing coverage of multiple frequency bands using the same LNA reduces component count, lowers area, and/or decreases costs. Moreover, using a single LNA for covering multiple frequency bands can enhance feature support and band coverage.

LNAs can be specified to operate over multiple gain settings or modes to provide flexibility for controlling the gain of the RF receive signal for different signal-to-noise ratios (SNRs) and/or receive signal levels. In certain applications, LNAs can also be specified to operate with constraints relating to return loss, gain flatness, bandwidth, and/or other performance parameters.

Multi-mode broadband LNAs are disclosed herein. In certain embodiments, an LNA includes a first amplification stage and a second amplification stage having a lower gain than the first amplification stage. The LNA is operable in a plurality of operating modes including a first mode in which the first amplification stage and the second amplification stage operate in a cascade to amplify an RF receive signal, and a second mode in which the first amplification stage amplifies the RF receive signal and the second amplification stage is bypassed. The first amplification stage and the second amplification stage are also referred to herein as an input amplification stage and an output amplification stage, respectively.

In certain implementations, the first amplification stage provides the majority of the gain to meet the LNA's gain specifications. Additionally, the second amplification stage can be a very low gain amplifier having a desired load impedance (for instance, about 50 Ohm), which provides excellent output return loss and robustness to routing parasitics.

A tank inductor at an output of the first amplification stage provides resonance at the appropriate band frequencies, which helps the overall LNA achieve excellent gain flatness. The tank inductor also reduces the variation of the input impedance at the LNA's input, thereby allowing the use of input matching networks with fewer discrete components. As a result, RF performance is improved along with reduced system cost and complexity. In certain implementations, a single tank inductor is included at the output of the first amplification stage. The tank inductor can operate with a tank capacitor and/or a tank resistor, either or both of which can be controllable (for instance, based on gain setting).

The output of the second amplification stage can also include a tank inductor that resonates with the output routing parasitics.

In certain implementations, the first amplification stage includes selectable amplification branches that are chosen based on the selected mode.

Multi-mode operation of the LNA is achieved through the use of switches to enable/disable the amplification stages, component(s) of the tanks, and/or to provide other configurability. In certain implementations, an amount of degeneration inductance is also controllable for the first amplification stage and/or second amplification stage.

The LNAs herein can exhibit a number of benefits including, but not limited to, improved gain flatness across broad frequency band, reduced gain delta variation between gain modes, excellent output return loss, robustness to output trace routing parasitics, improved RF performance, and/or reduced system cost.

Figure 6A:
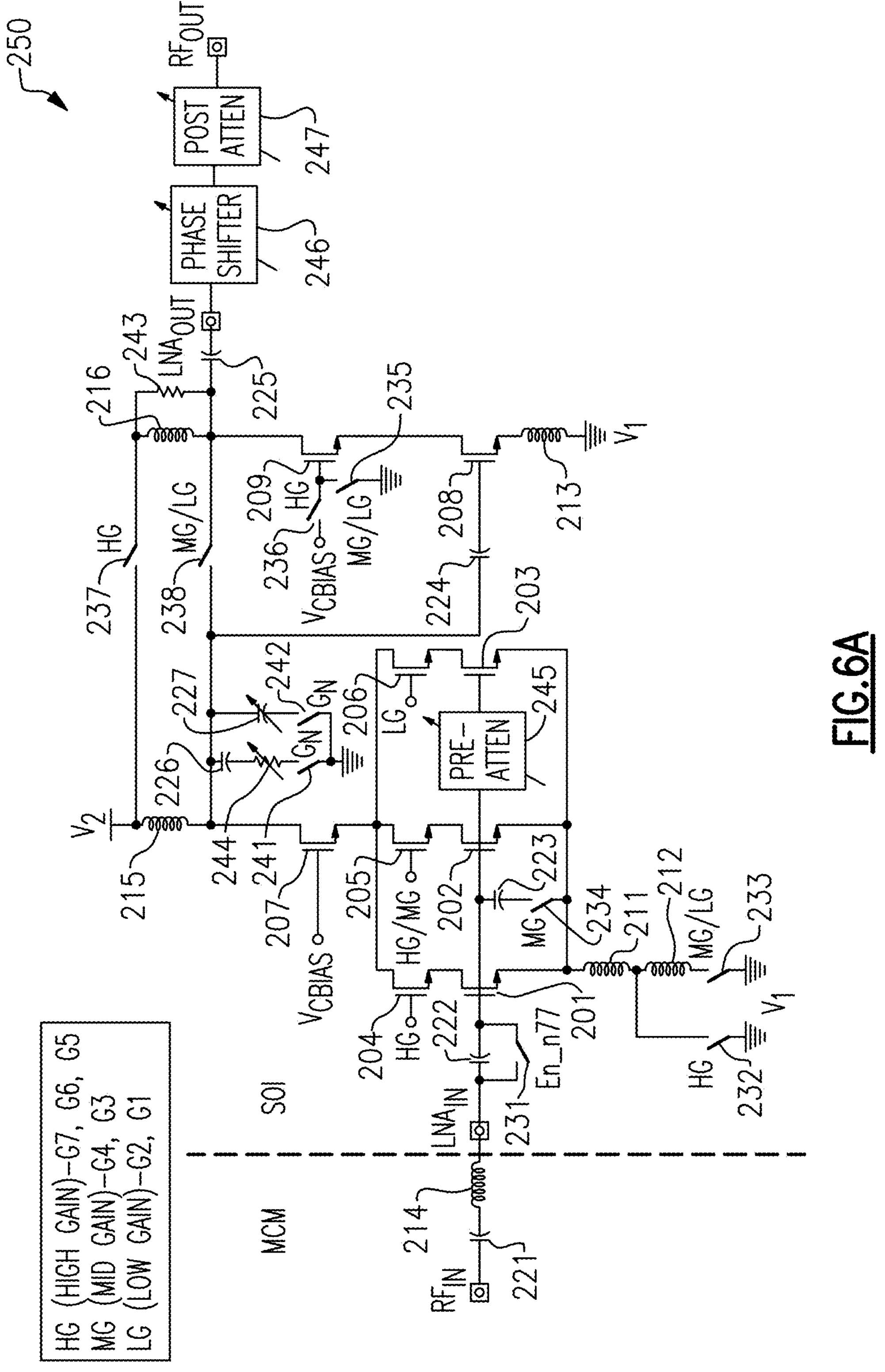
FIG. 6A is a schematic diagram of a multi-mode broadband low noise amplifier (LNA) according to one embodiment.

FIG. 6A is a schematic diagram of a multi-mode broadband LNA 250 according to one embodiment.

In the illustrated embodiment, the multi-mode broadband LNA 250 includes a first input stage gain transistor 201, a second input stage gain transistor 202, a third input stage gain transistor 203, a first input stage selection transistor 204, a second input stage selection transistor 205, a third input stage selection transistor 206, an input stage cascode transistor 207, an output stage gain transistor 208, an output stage cascode transistor 209, a first input stage degeneration inductor 211, a second input stage degeneration inductor 212, an output stage degeneration inductor 213, a series input inductor 214, a first tank inductor 215, a second tank inductor 216, an input DC blocking capacitor 221, an input stage input matching capacitor 222, a gate capacitance compensation capacitor 223, an output stage input matching capacitor 224, an output stage tank capacitor 225, a tank DC blocking capacitor 226, a tank capacitor array 227, an input capacitor bypass switch 231, a first degeneration selection switch 232, a second degeneration selection switch 233, a gate capacitance compensation switch 234, a shunt bias control switch 235, a series bias control switch 236, an output tank enabling switch 237, an output stage bypass switch 238, a tank resistor switch bank 241, a tank capacitor switch bank 242, an output termination resistor 243, a tank resistor array 244, a pre-attenuator 245, an output phase shifter 246, and a post attenuator 247.

Although one embodiment of a multi-mode broadband LNA is depicted, the teachings herein are applicable to LNAs implemented in a wide variety of ways. Accordingly, other implementations are possible.

With continuing reference to FIG. 6A, the multi-mode broadband LNA 250 receives an RF receive signal from an RF input terminal $RF_{IN}$, and generates an amplified RF receive signal at an RF output terminal $RF_{OUT}$. Additionally, the multi-mode broadband LNA 250 is connected to a first DC voltage $V_1$ (for instance, ground) and a second DC voltage $V_2$ (for instance, a power supply voltage).

The multi-mode broadband LNA 250 is operable in multiple gain settings G1, G2, G3, G4, G5, G6, and G7, which provide increasing amounts of gain. Although the multi-mode broadband LNA 250 operates with seven gain settings, the teachings herein are applicable to LNAs that operate with more or fewer gain settings. Gain settings G1 and G2 are associated with a low gain (LG) mode, gain settings G3 and G4 are associated with a mid gain (MG) mode, and gain settings G5, G6, and G7 are associated with a high gain (HG) mode, in this example. Thus, three main gain modes (coarse gain levels) are provided, with each main gain mode having settings for further gain adjustment (fine gain levels).

In the illustrated embodiment, control signals for the switches are depicted, where LG indicates the switch is closed (turned on) in LG mode and otherwise opened (turned off), MG indicates the switch is closed in MG mode and otherwise opened, HG indicates the switch is closed in HG mode and otherwise opened, MG/LG indicates the switch is closed in MG mode or LG mode and opened in HG mode, and HG/MG indicates the switch is closed in HG mode or MG mode and opened in LG mode. The tank resistor switch bank 241 and the tank capacitor switch bank 242 are controlled by a control signal $G_N$ that has a value that is based on the chosen gain setting.

The control signals for the circuits and switches can be generated using any suitable control circuitry. In certain implementations, a digital control circuit is programmable based on a data received over an interface or bus.

In the illustrated embodiment, switch 235 (controlled by MG/LG), switch 236 (controlled by HG), switch 237 (controlled by HG), and switch 238 (controlled by MG/LG) are used to select the output amplification stage in HG mode and to bypass the output amplification stage when operating in LG mode or MG mode.

Thus, when operating in HG mode, the input amplification stage and the output amplification stage operate in cascade (with an output of the input amplification stage driving an input of the output amplification stage) to amplify the RF receive signal. Additionally, when operating in LG mode or MG mode, the input amplification stage amplifies the RF receive signal and the output amplification stage is bypassed.

In the illustrated embodiment, when the output amplification stage is bypassed, the output stage cascode transistor 209 is decoupled from a cascode bias voltage $V_{CBIAS}$ and disabled using switch 235 and switch 236, and the second tank inductor 216 is decoupled from power using the switch 237. Additionally, the switch 238 serves to couple the output of the input amplification stage to the LNA's output $LNA_{OUT}$, thereby bypassing the output amplification stage.

The multi-mode broadband LNA 250 of FIG. 6A includes selectable gain transistors in the input amplification stage. In particular, the first input stage selection transistor 204 (controlled by HG) selects the first input stage amplification transistor 201 in the HG mode. Additionally, the second input stage selection transistor 205 (controlled by HG/MG) selects the second input stage amplification transistor 202 in the HG mode or the MG mode. Furthermore, the third input stage selection transistor 206 (controlled by LG) selects the third input stage amplification transistor 203 in the LG mode. As shown in FIG. 6A, when selected, each of the amplification transistors 201-203 is connected to the output of the input amplification stage through the input stage cascode transistor 207, which is biased by the bias voltage $V_{CBIAS}$.

When operating in HG mode, two amplification transistors 204/205 are active and operate in parallel to amplify the RF receive signal. However, when operating in MG mode, only one amplification transistor 205 is active. To compensate for an input gate capacitance difference between the HG mode (in which two amplification transistors are active) and the MG mode (in which one amplification transistor is active), the switch 234 (controlled by MG) is closed in the MG mode to increase the input capacitance using the gate capacitance compensation capacitor 223.

When operating in LG mode, the amplification transistor 203 is active. As shown in FIG. 6A, the gate of the amplification transistor 203 is coupled to the LNA's input $LNA_{IN}$ through the pre-attenuator 245, which provides an attenuation to enhance linearity in the LG mode. In certain implementations, the pre-attenuator 245 is controllable, for instance, based on the gain setting. The pre-attenuator 245 can be implemented in a wide variety of ways, for instance using resistive networks (for example, Tee "T" networks) and/or reactive networks.

The multi-mode broadband LNA 250 of FIG. 6A also includes input stage degeneration inductance that is controllable based on gain mode. In this example, the switch 232 (controlled by HG) is used to bypass the second input stage degeneration inductor 212 in the HG mode. Additionally, the switch 233 (controlled by MG/LG) is closed in the MG mode or LG mode such that the input amplification stage operates with a degeneration inductance corresponding to the series combination of the first input stage degeneration inductor 211 and the second input stage degeneration inductor 212.

To facilitate multi-band operation, switch 231 is closed in an n77 mode (which also can cover n78 is certain implementations) and open in an n79 mode, thereby selectively bypassing the input stage input matching capacitor 222. Thus, the input capacitance adjustment maintains proper input matching as the frequency band of operation changes. In this example, the multi-mode broadband LNA 250 operates across the n77 (or n77/n78) and n79 frequency bands. However, other implementations are possible.

In the illustrated embodiment, the tank resistor array 244 and the tank capacitor array 227 have a resistance and a capacitance, respectively, that is controlled using switch banks 241/242 based on the particular gain setting. Thus, the tank impedance is fine-tuned based on the gain setting.

As shown in FIG. 6A, the output termination resistor 243 (for instance, a 50 Ohm resistor) is included to aid in providing robust output matching over a broad frequency range. The output stage degeneration inductor 213 is included to provide an appropriate impedance with a noiseless resistive component that loads the output of the input amplification stage to aid in improving the noise figure.

The multi-mode broadband LNA 250 of FIG. 6A includes the phase shifter 246, which provides a phase shift that changes based on the gain setting. The phase shifter 246 is used to maintain substantially constant phase shift (from $LNA_{IN}$ to $LNA_{OUT}$) across gain settings. For example, the phase shifter 246 can be used to compensate for a phase shift that occurs when the output amplification stage is bypassed.

In the illustrated embodiment, the post attenuator 247 is included for providing flexibility for providing gain adjustment for a given gain setting.

The multi-mode broadband LNA 250 is implemented on a silicon-on-insulator (SOI) chip attached to a multi-chip-module (MCM), in some embodiments. FIG. 6A depicts a configuration in which a first portion of the components are implemented on the MCM, while a second portion are implemented on the SOI die. However, other implementations are possible.

Figure 6B:
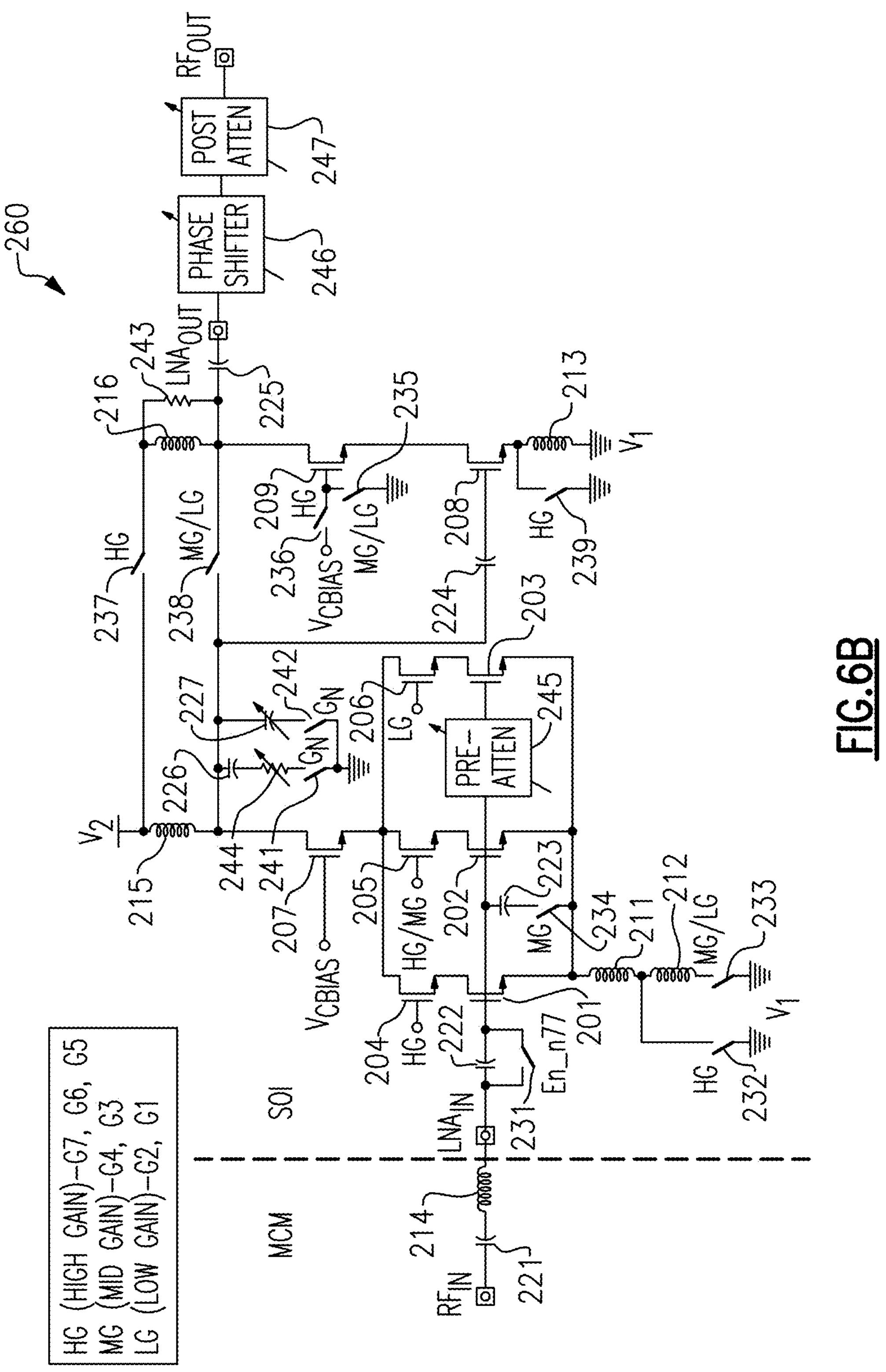
FIG. 6B is a schematic diagram of a multi-mode broadband LNA according to another embodiment.

FIG. 6B is a schematic diagram of a multi-mode broadband LNA 260 according to another embodiment.

The multi-mode broadband LNA 260 of FIG. 6B is similar to the multi-mode broadband LNA 250 of FIG. 6A, except that the multi-mode broadband LNA 260 further includes an output stage degeneration control switch 239 (controlled by HG).

In the illustrated embodiment, the output stage degeneration inductor 213 is bypassed in the HG mode to provide higher gain at the expense of a decrease in linearity and noise figure.

Figure 7:
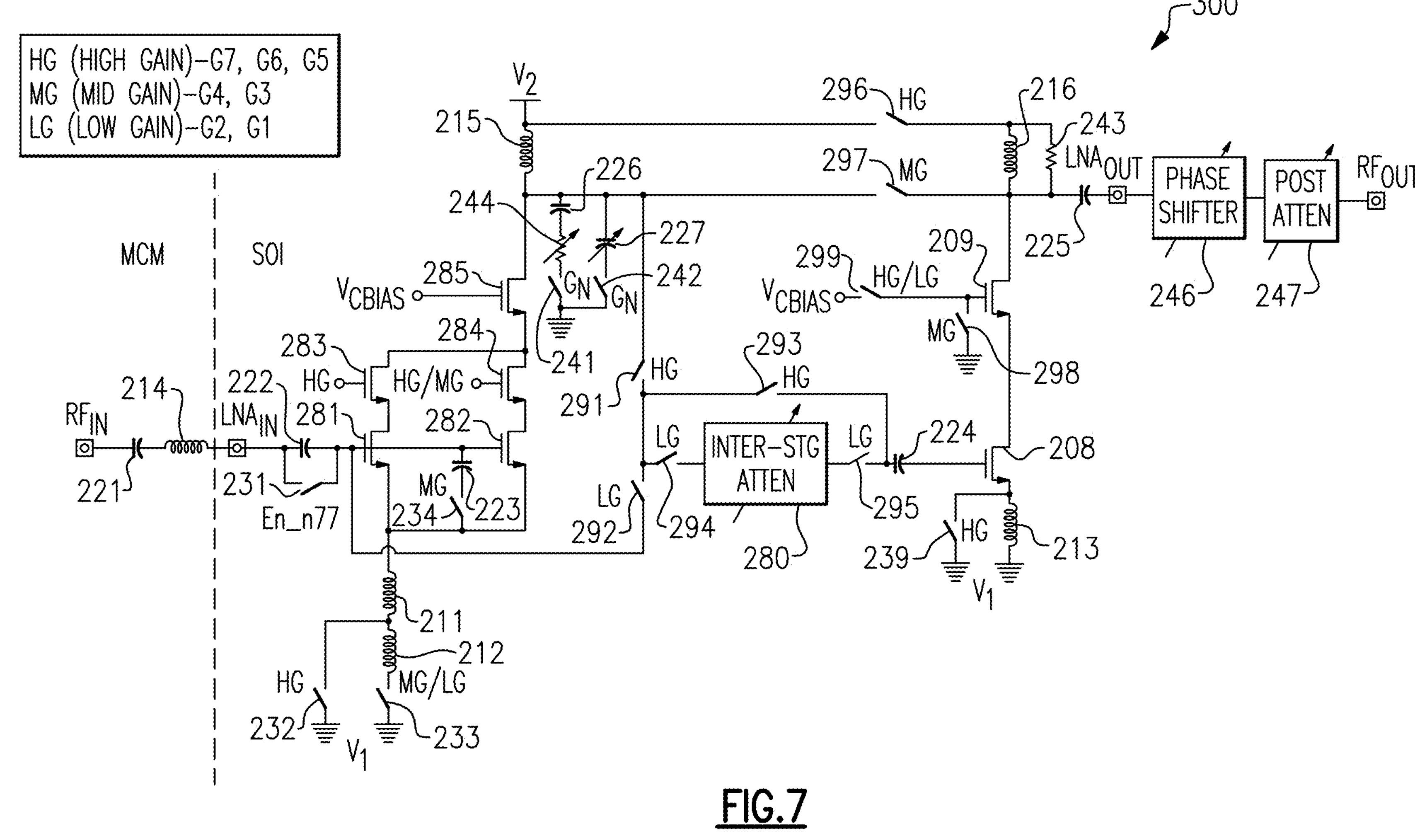
FIG. 7 is a schematic diagram of a multi-mode broadband LNA according to another embodiment.

FIG. 7 is a schematic diagram of a multi-mode broadband LNA 300 according to another embodiment. The multi-mode broadband LNA 300 includes a first input stage gain transistor 281, a second input stage gain transistor 282, a first input stage selection transistor 283, a second input stage selection transistor 284, an input stage cascode transistor 285, an output stage gain transistor 208, an output stage cascode transistor 209, a first input stage degeneration inductor 211, a second input stage degeneration inductor 212, an output stage degeneration inductor 213, a series input inductor 214, a first tank inductor 215, a second tank inductor 216, an input DC blocking capacitor 221, an input stage input matching capacitor 222, a gate capacitance compensation capacitor 223, an output stage input matching capacitor 224, an output stage tank capacitor 225, a tank DC blocking capacitor 226, a tank capacitor array 227, an input capacitor bypass switch 231, a first degeneration selection switch 232, a second degeneration selection switch 233, a gate capacitance compensation switch 234, an output stage degeneration control switch 239, a tank resistor switch bank 241, a tank capacitor switch bank 242, an output termination resistor 243, a tank resistor array 244, an output phase shifter 246, a post attenuator 247, an inter-stage attenuator 280, a first inter-stage coupling switch 291, an input stage bypass switch 292, a second inter-stage coupling switch 293, a second input stage bypass switch 294, a third input stage bypass switch 295, an output tank enabling switch 296, an output stage bypass switch 297, a shunt bias control switch 298, and a series bias control switch 299.

In comparison to the multi-mode broadband LNA 260 of FIG. 6B, the multi-mode broadband LNA 300 of FIG. 7 bypasses the input amplification stage in the LG mode. In particular switch 292 (controlled by LG), switch 294 (controlled by LG), and switch 295 (controlled by LG) are closed in the LG mode to couple the LNA input $LNA_{IN}$ to an input of the amplification switch by way of a bypass path through the inter-stage attenuator 280. The inter-stage attenuator 280 can be implemented in a wide variety of ways including, but not limited to, using resistive networks and/or reactive networks. In certain implementations, the inter-stage attenuator 280 provides attenuation that changes based on gain setting.

When in the HG mode, switches 292, 294, and 295 are opened, and switch 291 (controlled by HG) and switch 293 (controlled by HG) close such that the input amplification stage and the output amplification stage operate in cascade. Additionally, since the first input stage selection transistor 283 (controlled by HG) and the second input stage selection transistor 284 (controlled by HG/MG) are turned on in the HG mode, both the first input stage gain transistor 281 and the second input stage gain transistor 282 are active in the HG mode.

In the MG mode, the first input stage selection transistor 283 (controlled by HG) turns off while the second input stage selection transistor 284 (controlled by HG/MG) turns on, and thus the second input stage gain transistor 282 is active in the MG mode. Additionally, the switch 297 (controlled by MG) bypasses the output amplification stage in the MG mode.

Switch 298 (controlled by MG) and switch 299 (controlled by HG/LG) are used to bypass the second stage in the MG mode while biasing the second stage in the HG or LG modes.

Additional details of the multi-mode broadband LNA 300 of FIG. 7 are similar to those of the multi-mode broadband LNAs of FIGS. 6A and 6B.

Figure 8:
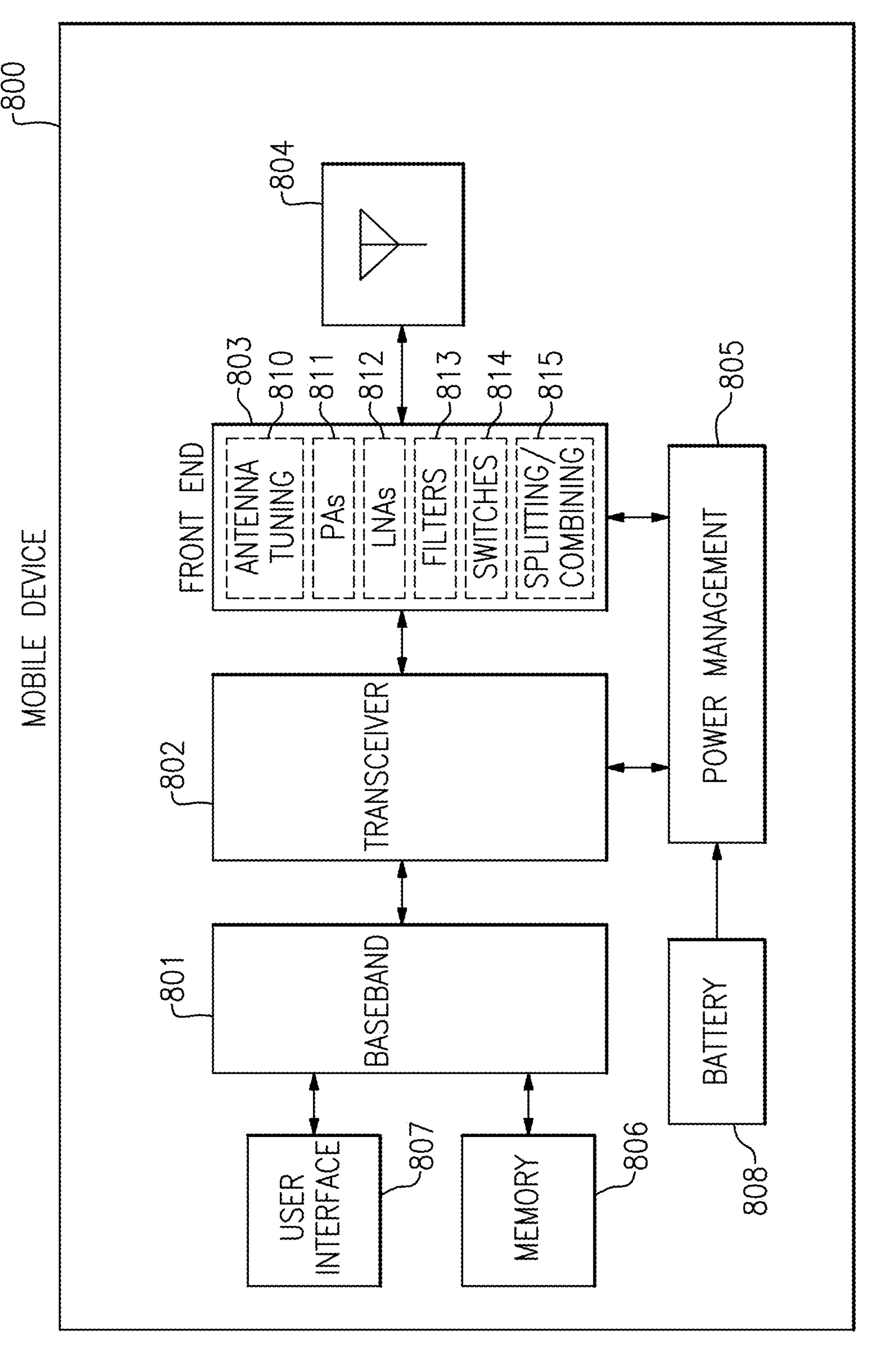
FIG. 8 is a schematic diagram of one embodiment of a mobile device.

FIG. 8 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 8 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAS) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 8, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 8, the power management system 805 receives a battery voltage from the battery 808. The battery 808 can be any suitable battery for use in the mobile device 800, including, for example, a lithium-ion battery.

Figure 9A:
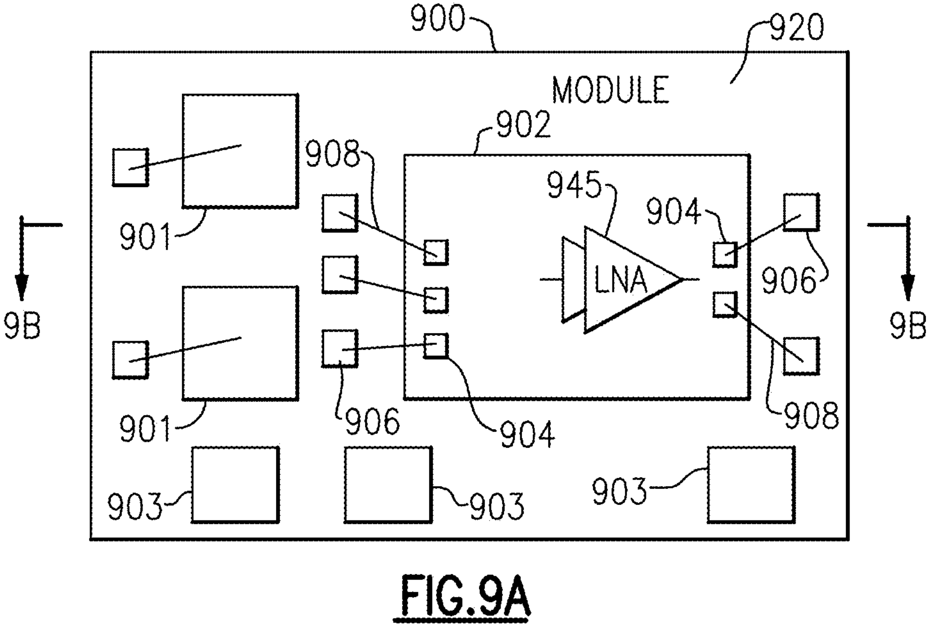
FIG. 9A is a schematic diagram of one embodiment of a packaged module.
Figure 9B:
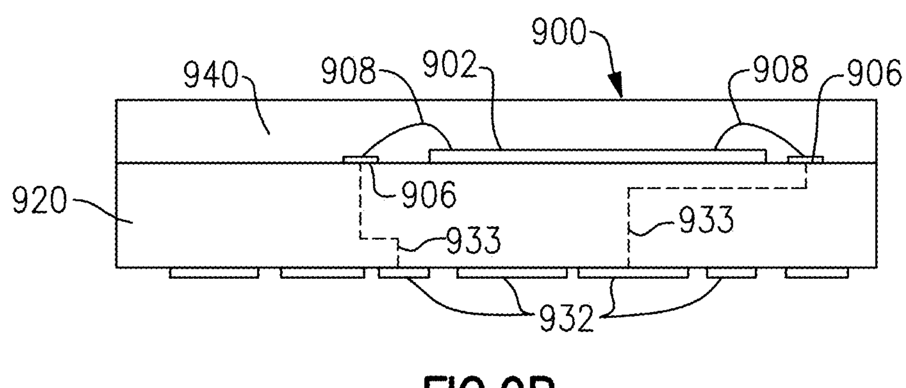
FIG. 9B is a schematic diagram of a cross-section of the packaged module of FIG. 9A taken along the lines 9B-9B.

FIG. 9A is a schematic diagram of one embodiment of a packaged module 900. FIG. 9B is a schematic diagram of a cross-section of the packaged module 900 of FIG. 9A taken along the lines 9B-9B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a low noise amplifier 945, which can be implemented in accordance with one or more features disclosed herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 9B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 9B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

Applications

The principles and advantages of the embodiments described herein can be used for a wide variety of applications.

For example, LNAs can be included in various electronic devices, including, but not limited to consumer electronic products, parts of the consumer electronic products, electronic test equipment, etc. Example electronic devices include, but are not limited to, a base station, a wireless network access point, a mobile phone (for instance, a smartphone), a tablet, a television, a computer monitor, a computer, a hand-held computer, a personal digital assistant (PDA), a microwave, a refrigerator, an automobile, a stereo system, a disc player, a digital camera, a portable memory chip, a washer, a dryer, a copier, a facsimile machine, a scanner, a multi-functional peripheral device, a wrist watch, a clock, etc. Further, the electronic devices can include unfinished products.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A low noise amplifier comprising:

an input terminal configured to receive a radio frequency receive signal;

an output terminal configured to output an amplified radio frequency receive signal;

an input amplification stage including a first gain transistor having a gate connected to the input terminal, a second gain transistor having a gate connected to the input terminal and a source connected to a source of the first gain transistor, a first selection transistor having a source connected to a drain of the first gain transistor, a second selection transistor having a source connected to a drain of the second gain transistor, and a cascode transistor having a source connected to a drain of the first selection transistor and to a drain of the second selection transistor;

an output amplification stage having an input connected to a drain of the cascode transistor and an output connected to the output terminal; and an output stage bypass switch connected between the drain of the cascode transistor and the output terminal, the low noise amplifier operable in a first gain mode in which the output stage bypass switch is turned off, and a second gain mode in which the output stage bypass switch is turned on to bypass the output amplification stage.

2. The low noise amplifier of claim 1 wherein the first selection transistor is turned on in the first gain mode and turned off in the second gain mode, and the second selection transistor is turned on in both the first gain mode and the second gain mode.

3. The low noise amplifier of claim 1 wherein the input amplification stage further includes a gate capacitance compensation capacitor and a switch in series between the gate of the first gain transistor and the source of first gain transistor.

4. The low noise amplifier of claim 3 wherein the switch is turned on in the second gain mode and turned off in the first gain mode.

5. The low noise amplifier of claim 1 wherein the input amplification stage further includes a third gain transistor, and a third selection transistor having a source connected to a drain of the third gain transistor and a drain connected to the source of the cascode transistor.

6. The low noise amplifier of claim 5 wherein the third selection transistor is turned off in the first gain mode and the second gain mode, and turned on in a third gain mode.

7. The low noise amplifier of claim 5 wherein the first gain mode is a high gain mode, the second gain mode is a mid gain mode, and a third gain mode is a low gain mode.

8. The low noise amplifier of claim 5 further comprising a pre-attenuator connected between the input terminal and a gate of the third gain transistor.

9. The low noise amplifier of claim 1 further comprising a tank circuit connected to the drain of the cascode transistor, the tank circuit including at least one controllable component having a different value in the first gain mode relative to the second gain mode.

10. A packaged module comprising:

a package substrate; and a semiconductor die attached to the package substrate, the semiconductor die including a low noise amplifier that includes an input terminal configured to receive a radio frequency receive signal, an output terminal configured to output an amplified radio frequency receive signal, and an input amplification stage including a first gain transistor having a gate connected to the input terminal, a second gain transistor having a gate connected to the input terminal and a source connected to a source of the first gain transistor, a first selection transistor having a source connected to a drain of the first gain transistor, a second selection transistor having a source connected to a drain of the second gain transistor, and a cascode transistor having a source connected to a drain of the first selection transistor and to a drain of the second selection transistor, the low noise amplifier further including an output amplification stage having an input connected to a drain of the cascode transistor and an output connected to the output terminal, and an output stage bypass switch connected between the drain of the cascode transistor and the output terminal, the low noise amplifier operable in a first gain mode in which the output stage bypass switch is turned off, and a second gain mode in which the output stage bypass switch is turned on to bypass the output amplification stage.

11. The packaged module of claim 10 wherein the first selection transistor is turned on in the first gain mode and turned off in the second gain mode, and the second selection transistor is turned on in both the first gain mode and the second gain mode.

12. A wireless device comprising:

an antenna configured to generate a radio frequency receive signal in response to a radio wave; and a front end system including a low noise amplifier that includes an input terminal configured to receive the radio frequency receive signal, an output terminal configured to output an amplified radio frequency receive signal, and an input amplification stage including a first gain transistor having a gate connected to the input terminal, a second gain transistor having a gate connected to the input terminal and a source connected to a source of the first gain transistor, a first selection transistor having a source connected to a drain of the first gain transistor, a second selection transistor having a source connected to a drain of the second gain transistor, and a cascode transistor having a source connected to a drain of the first selection transistor and to a drain of the second selection transistor, the low noise amplifier further including an output amplification stage having an input connected to a drain of the cascode transistor and an output connected to the output terminal, and an output stage bypass switch connected between the drain of the cascode transistor and the output terminal, the low noise amplifier operable in a first gain mode in which the output stage bypass switch is turned off, and a second gain mode in which the output stage bypass switch is turned on to bypass the output amplification stage.

13. The wireless device of claim 12 wherein the first selection transistor is turned on in the first gain mode and turned off in the second gain mode, and the second selection transistor is turned on in both the first gain mode and the second gain mode.

14. The wireless device of claim 12 wherein the input amplification stage further includes a gate capacitance compensation capacitor and a switch in series between the gate of the first gain transistor and the source of first gain transistor.

15. The wireless device of claim 14 wherein the switch is turned on in the second gain mode and turned off in the first gain mode.

16. The wireless device of claim 12 wherein the input amplification stage further includes a third gain transistor, and a third selection transistor having a source connected to a drain of the third gain transistor and a drain connected to the source of the cascode transistor.

17. The wireless device of claim 16 wherein the third selection transistor is turned off in the first gain mode and the second gain mode, and turned on in a third gain mode.

18. The wireless device of claim 16 wherein the first gain mode is a high gain mode, the second gain mode is a mid gain mode, and a third gain mode is a low gain mode.

19. The wireless device of claim 16 wherein the low noise amplifier further includes a pre-attenuator connected between the input terminal and a gate of the third gain transistor.

20. The wireless device of claim 12 wherein the low noise amplifier further includes a tank circuit connected to the drain of the cascode transistor, the tank circuit including at least one controllable component having a different value in the first gain mode relative to the second gain mode.

* * * * *